United States Patent
Nguyen et al.

(10) Patent No.: US 7,195,955 B2
(45) Date of Patent: Mar. 27, 2007

(54) TECHNIQUE FOR PROTECTING PHOTONIC DEVICES IN OPTOELECTRONIC PACKAGES WITH CLEAR OVERMOLDING

(75) Inventors: Luu Thanh Nguyen, Sunnyvale, CA (US); Ken Pham, San Jose, CA (US); Peter Deane, Los Altos, CA (US); William Paul Mazotti, San Martin, CA (US); Bruce Carlton Roberts, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 80 days.

(21) Appl. No.: 11/217,518

(22) Filed: Aug. 31, 2005

(65) Prior Publication Data

US 2006/0001183 A1    Jan. 5, 2006

Related U.S. Application Data

(62) Division of application No. 09/957,936, filed on Sep. 21, 2001, now Pat. No. 7,001,083.

(51) Int. Cl.
B29C 45/14 (2006.01)
H01L 21/56 (2006.01)

(52) U.S. Cl. .................. 438/116; 29/841; 264/272.17; 425/116

(58) Field of Classification Search ............... 438/112, 438/116, 117, 127; 29/841; 264/272.17; 425/127
See application file for complete search history.

(56) References Cited

U.S. PATENT DOCUMENTS

| | | | |
|---|---|---|---|
| 4,222,629 A | 9/1980 | Dassele et al. | |
| 4,241,978 A | 12/1980 | Dubois et al. | |
| 4,346,294 A | 8/1982 | Albaugh et al. | |
| 4,927,228 A | 5/1990 | Van De Pas | |
| 4,979,791 A | 12/1990 | Bowen et al. | |
| 5,218,759 A * | 6/1993 | Juskey et al. | 29/841 |
| 5,386,488 A | 1/1995 | Oikawa | |
| 5,499,312 A | 3/1996 | Hahn et al. | |
| 5,515,467 A | 5/1996 | Webb | |
| 5,515,468 A | 5/1996 | DeAndrea et al. | |
| 5,590,232 A | 12/1996 | Wentworth et al. | |
| 5,631,987 A | 5/1997 | Lasky et al. | |

(Continued)

FOREIGN PATENT DOCUMENTS

GB    2276033 A    9/1994

*Primary Examiner*—Robert B. Davis
(74) *Attorney, Agent, or Firm*—Beyer Weaver LLP

(57) ABSTRACT

This disclosure describes a clear overmolding cap for protecting the photonic devices in optoelectronic packages from damage due to handling, module assembly, board assembly, and environmental exposure in field applications. The overmolding of the devices with a clear mold cap or similar material also provides a standoff for optical fibers positioned next to the active facets. The photonic devices are attached to a substrate, which may be flexible that has electronic traces that allow the photonic devices to be connected to an external device such as a semiconductor device. A technique for manufacturing the overmolding cap using a mold die system in combination with a rigid carrier is also disclosed. The rigid carrier is used to maintain the shape of the substrate during the molding process. The proposed method applies to photonic devices used in optoelectronic packages that can serve as transceivers, transmitters, or receivers.

6 Claims, 9 Drawing Sheets

U.S. PATENT DOCUMENTS

| | | |
|---|---|---|
| 5,857,050 A | 1/1999 | Jiang et al. |
| 6,224,936 B1 * | 5/2001 | Gochnour et al. .......... 438/127 |
| 6,364,542 B1 | 4/2002 | Deane et al. |
| 6,458,629 B2 * | 10/2002 | Kobayashi ................. 438/127 |
| 6,589,814 B1 * | 7/2003 | Mostafazadeh et al. ..... 438/112 |
| 6,655,854 B1 | 12/2003 | Nguyen et al. |
| 6,709,170 B2 | 3/2004 | Tartaglia et al. |
| 6,712,527 B1 | 3/2004 | Chan et al. |
| 6,724,015 B2 | 4/2004 | Nelson et al. |
| 2001/0016374 A1 * | 8/2001 | Jiang et al. ................. 438/127 |
| 2001/0046764 A1 * | 11/2001 | Ohuchi ....................... 438/112 |

* cited by examiner

TECHNIQUE FOR PROTECTING PHOTONIC DEVICES IN OPTOELECTRONIC PACKAGES WITH CLEAR OVERMOLDING

CROSS-REFERENCE TO RELATED APPLICATIONS

This is a Divisional application of prior U.S. Application No. 09/957,936, entitled "TECHNIQUE FOR PROTECTING PHOTONIC DEVICES IN OPTOELECTRONIC PACKAGES WITH CLEAR OVERMOLDING", filed on Sep. 21, 2001 and now U.S. Pat. No. 7,001,083, which is incorporated herein by reference and from which priority under 35 U.S.C. § 120 is claimed.

This application is related to U.S. patent application Ser. No. 09/922,598 filed on Aug. 3, 2001, and entitled "TECHNIQUES FOR JOINING AN OPTO-ELECTRONIC MODULE TO A SEMICONDUCTOR PACKAGE," and to U.S. patent application Ser. No. 09/568,094, filed on May 9, 2000, and entitled "DEVICE AND METHOD FOR PROVIDING A TRUE SEMICONDUCTOR DIE TO EXTERNAL FIBER OPTIC CABLE CONNECTION," and to U.S. patent application Ser. No. 09/922,601, filed on Aug. 3, 2001, and entitled "OPTICAL SUB-ASSEMBLY FOR OPTO-ELECTRONIC MODULES," and to U.S. patent application Ser. No. 09/922,357, filed on Aug. 3, 2001, and entitled "OPTOELECTRONIC PACKAGE WITH DAM STRUCTURE TO PROVIDE FIBER STANDOFF," and to U.S. patent application Ser. No. 09/922,946, filed on Aug. 3, 2001, and entitled "OPTOELECTRONIC PACKAGE WITH CONTROLLED FIBER STANDOFF," the content of which is hereby incorporated by reference.

BACKGROUND OF THE INVENTION

The present inventions relate generally to mechanisms sealing and protecting photonic devices in optoelectronic packages. More particularly, the photonic device is overmolded with a clear molding material. When appropriate, the clear molding material may be used to control the standoff distance between an optical fiber and the photonic device.

Optical networks have a wide variety of applications and are, for example, widely used within the telecommunications, data transmission and high speed networking industries. The optical devices used to convert electrical signals into light signals and light signals into electrical signals are key components in any such optical network. Generally, such devices include one or more photonic elements (e.g. detectors and/or laser emitters) together with the electronic circuitry necessary to drive the photonic elements (e.g., receiver, transmitter or transceiver circuitry). Although a wide variety of optical transceiver devices are currently commercially available, there are always continuing efforts to improve their design and functionality as well as to lower their production costs.

At the time of this writing, most commercially available photonic devices are placed in sealed packages such as TO (transistor outline) metal cans or ceramic chip carriers. A transparent glass or plastic window is then positioned over the active area of the photonic device. The die is typically adhered to the carrier and electrically connected to traces on the carrier using wire bonding.

One issue that is fundamental to the design of any photonic device is the desire to (relatively) efficiently optically couple each active facet (i.e., emitter or receiver) to its associated optical fiber. When photonic devices are packaged in metal cans or ceramic carriers, there is an inherent standoff distance between the optical fiber or fiber bundle and the active facets of the devices. Typical standoff distances in currently available packages tend to be in the range of 1–5 mm depending upon the type of packaged used. At these distances, it becomes important to collimate the optical fibers to insure good optical coupling between the fibers and the photonic elements. Typically, collimation is accomplished by providing a simple lens at the termination of the optical fiber.

Although the described packaging techniques work well, they are relatively expensive to produce. Accordingly, there are continuing efforts to provide improved optical component packaging techniques that help reduce the size and costs of the optical components.

BRIEF SUMMARY OF THE INVENTION

This invention describes a method of protecting the photonic devices in optoelectronic packages from damage due to handling, module assembly, board assembly (e.g., during surface mount reflow), and environmental exposure in field applications. The overmolding of the devices with a clear epoxy mold compound or similar material can also provide a standoff for optical fibers positioned next to the active facets. Close proximity of fiber and facet provides for enhanced optical coupling efficiency. The proposed method applies to photonic devices used in optoelectronic packages that can serve as transceivers, transmitters, or receivers.

One aspect of the present invention pertains to an optoelectronic package which includes a substrate, a photonic device carried by the substrate, the photonic device having an active facet thereon, an optical fiber in optical communication with the active facet on the photonic device, and an optically clear cap that is molded over the photonic device to cover the active facet of the photonic device.

As a method, one embodiment of the present invention includes at least a method of manufacturing an optoelectronic device involving the operations of attaching a photonic device directly or indirectly to a flexible substrate, attaching the flexible substrate onto a rigid carrier, whereby the rigid carrier maintains the flexible substrate in a fixed position, placing the flexible substrate and the rigid carrier onto a lower mold such that the photonic device is lowered into a molding cavity within the lower mold, and forming an optically clear cap on the base substrate by flowing a clear resin into a molding cavity of a molding die.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to a clear overmolding used to protect a photonic array device from structural and environmental damage. The overmolding encapsulates a photonic array and the wirebonds that connect the photonic array to an electronic substrate. In addition to protecting the photonic array, the overmolding provides a standoff distance between the photonic device and optical fibers to be connected thereto by providing a surface to which to register the optical fibers.

Figure 1:
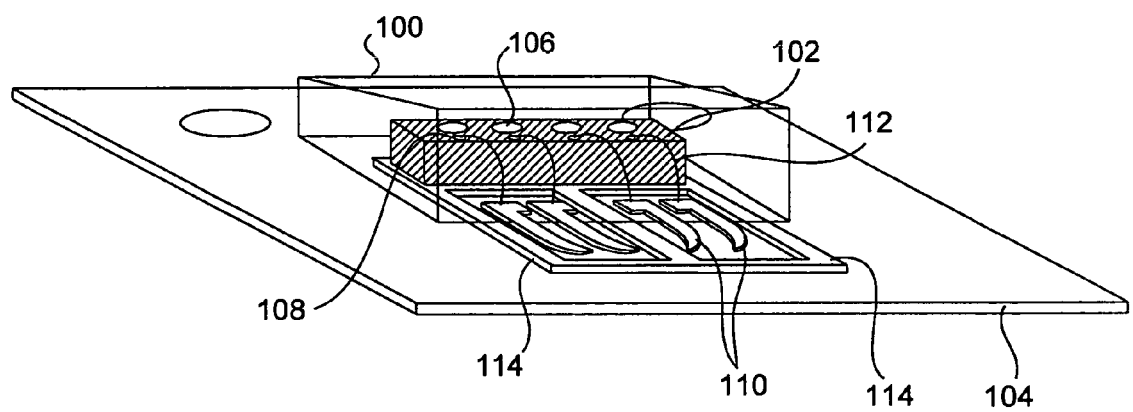
FIG. 1 illustrates a perspective view of a clear overmolding cap that encapsulates a photonic array device, which is attached to a substrate, according to one embodiment of the present invention.

FIG. 1 illustrates a perspective view of a clear overmolding cap 100 that encapsulates a photonic array device 102, which is attached to a substrate 104, according to one embodiment of the present invention. The photonic device 102 contains an array of circuits that are either lasers or detectors. The active areas, or active facets 106, and the anodes 108 of the photonic device 102 are on the top surface of the photonic device 102. The anodes 108 are connected to the contact pads of the electrical traces 110 through bonding wires 112. The overmolding cap 100 encapsulates and protects photonic array device 102 and bonding wires 112. The cathode of the photonic device 102 is typically located on the opposite surface of the photonic device 102 containing the anodes 108 and the active facets 106. In this particular embodiment, the bonding wires 112 are ball bonded to the electrical traces 110 and stitch bonded to the anodes 108. This technique, referred to as reverse wirebonding, allows the loop height of the bonding wire to be kept to a minimum. The lower loop height allows the overall height of the overmolding cap 100 to be minimized because a shorter cap can be used to encapsulate both photonic device 102 and bonding wire 112. Ultimately, the lower height of the cap 100 allows an optical fiber to be placed as close as possible to the active facets 106 of the photonic device 102 since the overmolding cap 100 acts as a standoff for the fiber or fiber bundle. As will be seen in FIG. 3, optical fibers are placed directly in contact with the overmolding cap.

In the embodiment shown in FIG. 1, the thickness of the overmolding cap 100 in the region directly over the active facet 106 is approximately 0.1 mm. Theoretically, an optical fiber or fiber bundle can be positioned directly against the coating, keeping the standoff at approximately 100 microns.

The clear overmolding cap 100 acts as a protective coating over the entire photonic exposed areas (top active facets and all four sides of the devices or array). Protection can be against a number of factors such as damage to the passivation during the pick and place step, board assembly operations, thermal expansion, and field operations. By covering the wirebonds 112 connecting the photonic device 102 to the substrate 104, the overmolding cap 100 prevents damage to the fragile wirebonds. Firm encapsulation of the wires ensures that the devices and modules are protected against damage induced by vibration, impact, and shock.

The top surface of the overmolding cap 100 is slanted at an angle with respect to the top surface of the photonic device 102. The slant angle is approximately 7–8 degrees. This angle reduces the amount of back reflection between a laser photonic device and an optical fiber placed in optical communication with the photonic device. Back reflection is the reflection of transmitted light back towards the light source. Slant on the overmolding cap is the best mode for preventing back reflection for transmitter photonic arrays. The slant angle is not as critical for detector photonic arrays. Reducing back reflection increases the optical coupling efficiency. In alternative embodiments the slant angle may be configured at various other angles.

Since the top surface of the overmolding cap 100 has a slanted top surface, the cap 100 is thicker at one end relative to the opposite end of the cap. It is preferable to orient the cap 100 such that the thicker end of the cap encapsulates the bond wire 112. In this way, the overall thickness (and height) of the cap 100 can be kept to a minimum.

The encapsulating material forming the overmolding cap 100 is an index matching epoxy molding compound, but could be any similar unfilled thermoset including reactive silicone gels with index matching characteristics. Index matching refers to the fact that the index of refraction of the overmolding cap material is selected to match the index of refraction for photonic device 102, the atmosphere in between the fiber and the overmolding cap, and the optical fiber. Optimization of the index of refraction values also serves to minimize back reflection. The index of refraction can be selected with the aid of a software modeling program. Depending upon the specific implementation of the invention, the index of refraction of the overmolding is selected to match, as best as possible, the index of refraction of the optical fiber core, the photonic array, and air. A typical index of refraction for the overmolding is in the range of approximately 1.45 to 1.51.

Preferably, the material forming the overmolding cap 100 does not contain fillers. Athough the fillers would reduce the coefficient of thermal expansion of the compound, which is desirable for thermal shock/thermal cycling performance, material clarity for light transmission would be impacted.

The traces 110 on substrate 104 provide a pathway for connecting the anodes 108 to an electrical device, such as a semiconductor die, suitable for driving the photonic device 102. The outer electrical traces 114 provide pathways for connecting the cathode of the photonic device 102 to an external electrical device. In certain embodiments of the invention, the substrate 104 is a thin, flexible material.

In alternative embodiments, the overmolding cap 100 can cover various photonic devices and configurations thereof on a substrate. For instance, the photonic device could be rotated such that the active facets 106 are in a plane perpendicular to the top surface of the substrate 104. Such a rotated photonic device can be set within the substrate by placing it in an etched groove within the substrate and connected to the electrical traces of the substrate through conductive adhesive or solder. For more detail describing such a configuration, please refer to U.S. patent application Ser. No. 10/165,548.

Figure 2A:
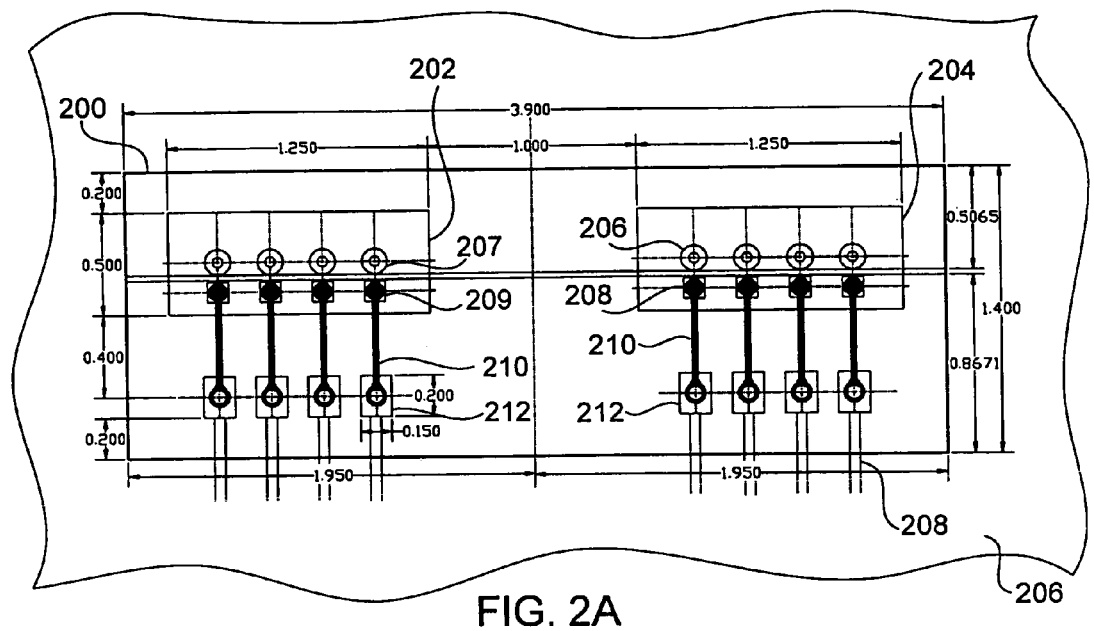
FIG. 2A illustrates a top plan view of a clear overmolding cap, which encapsulates two photonic array devices, according to one embodiment of the invention.

FIG. 2A illustrates a top plan view of a clear overmolding cap 200, which encapsulates two photonic array devices 202 and 204, according to one embodiment of the invention. The photonic array devices 202 and 204 are mounted on a substrate 206 that has electrical traces 208. Each of photonic devices 202 and 204 can be either light emitters or detectors. When device 202 and device 204 are an emitter and a detector, respectively, the photonic module can be used to make an optical transceiver. Active facets 207 and anode pads 209 are seen on the top surfaces of each of the photonic devices 202 and 204. Bond wires 210 connect each of the anode pads 209 to the contact pads 212 of the electrical traces 208.

Figure 2B:
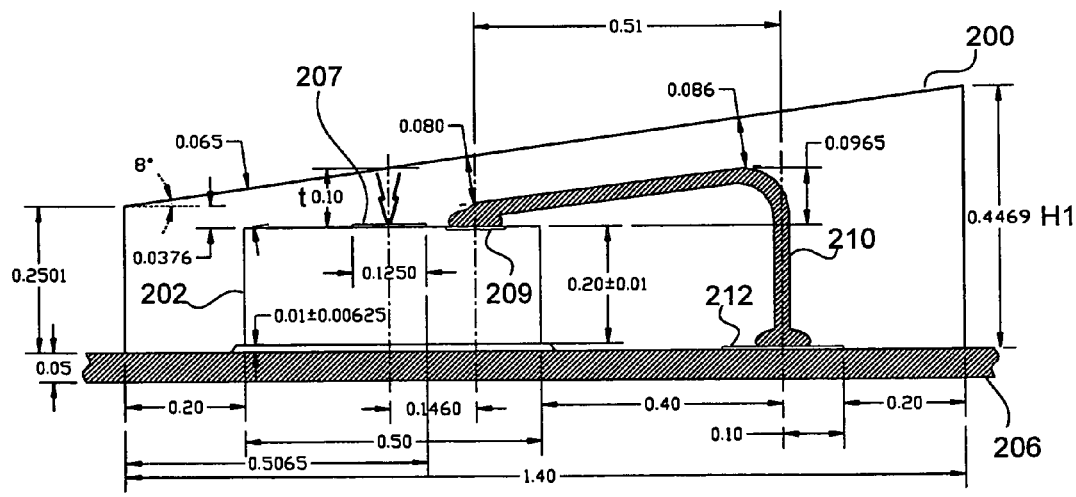
FIG. 2B illustrates a side plan view of the overmolding cap of FIG. 2A.

FIG. 2B illustrates a side plan view of the overmolding cap 200 of FIG. 2A. FIG. 2B shows that the bond wire 210 has been ball bonded to the contact pad 212 of the electrical trace and stitch bonded to the anode pad 209 of photonic device 202. FIG. 2B also illustrates the preferred embodiment in which the bond wire 210 is encapsulated within the thicker portion of the overmolding cap 200. The thicker portion of the cap 200 being the half of the cap having the taller height, $H_1$, due to the upward slant of the top surface of the cap 200. Thickness, $t_1$, is the thickness of the cap 200 over the region of the active facet 207. In this embodiment, $t_1$ is approximately 0.1 mm.

Figure 3:
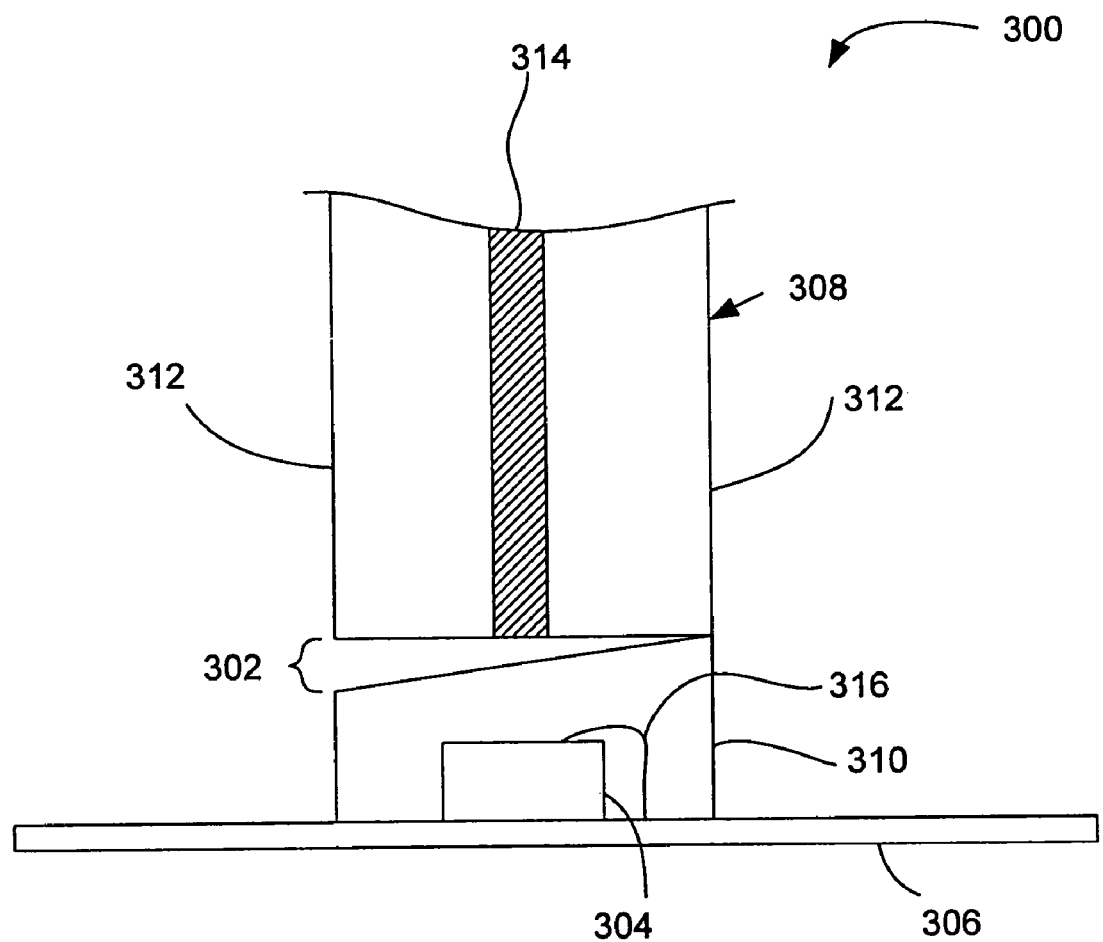
FIG. 3 illustrates a side plan view of the optical interface region of an optoelectronic package formed in accordance with one embodiment of the invention.

FIG. 3 illustrates a side plan view of the optical interface region 302 of an optoelectronic package 300 formed in accordance with one embodiment of the invention. In the illustrated embodiment, a photonic device die 304 is mounted and electrically connected to a substrate 306 such that the active facet (active region) of the photonic device 304 is exposed outward toward an optical fiber 308. An optically clear cap 310 is formed on the substrate to serve as a registration surface for the optical fiber. During assembly, a cladding portion of the optical fiber 312 is brought into contact with the cap 310 so that the cap effectively defines the standoff distance between the substrate 306 and the facet of the photonic device 304. The inner core 314 of the optical fiber 308 is aligned with the active facet of the photonic device 304. Not shown in FIG. 3 are the various other mechanisms, pins, etc. that are used to secure the optical fiber to the cap 310.

The substrate 306 has one or more conductive traces (not shown) thereon. The photonic device may be electrically coupled to the conductive trace(s) by any suitable connection technique. In the embodiment shown bonding wire 316 is used. However, it should be appreciated that a wide variety of other suitable techniques, including (but not limited to) TAB, direct soldering (e.g. "flip chip" type mounting), and conventional package mounting techniques (e.g. soldering, pins, etc.) can readily be used in particular implementations.

Figure 4:
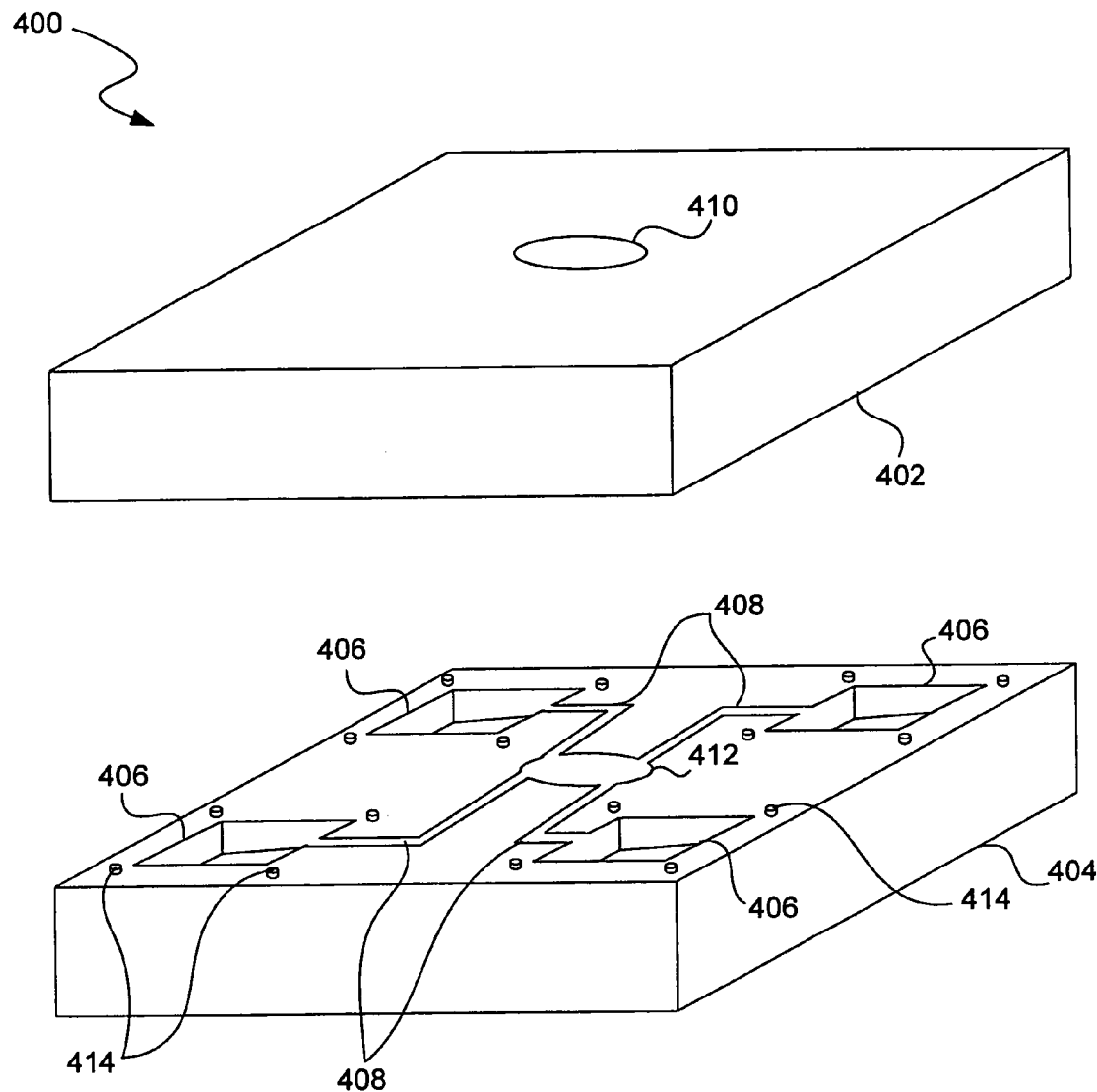
FIG. 4 illustrates a perspective view of one embodiment of a molding system for making the overmolding cap of the present invention.

Now the technique for forming the overmolding cap of the present invention will be described. FIG. 4 illustrates a perspective view of one embodiment of a molding system 400 for making the overmolding cap of the present invention. Molding system 400 includes a top mold 402 and a bottom mold 404. Bottom mold 404 contains four cavities 406 having the outline of the overmolding cap that is intended to be formed. For example, if the overmolding cap is to have a slanted top surface, then the bottom surface of the mold cavities 406 must have a slanted bottom surface. The surface of the mold cavities 406 must be very smooth to impart the overmolding with a smooth surface. In some embodiments, the surface of the cavities are provided a layer of metal, such as polished plated nickel, which gives the cavities a smoother surface. Runners 408 are channels within the bottom mold 404 that distribute the clear molding compound to the respective mold cavities 406. Mold material flows from the hole 410 in the top mold, down into the pot 412, from which the mold material then flows into each of the runners 408. A substrate containing photonic devices that are attached thereto is placed onto the bottom mold 406 so that the photonic devices fall within each of the mold cavities 406. Overmold caps are formed when the mold cavities 406 are filled with overmold material or resin. The upper mold 402 is lowered onto the substrate so to secure the substrate and apply pressure and heat needed to fully form the cap. The flexible substrate used to attach the photonic arrays can be designed to be sufficiently thick to avoid sagging or crimping while clamped inside the hot mold. This can be achieved, for instance, by adding to the standard polyimide core (50 micron) one or two layers of copper. When two copper layers are used, both sides of the substrate are used. Indexing pins 414 protrude from the lower mold 404 to mate with indexing holes in the substrate so to properly align the two components and to secure the substrate during the molding process. Upon molding and post-curing, the flexible substrate and associated carrier can be sawed and singulated into units for further processing.

To obtain the optimum optical transmission qualities of the overmolding, voids within the overmolding must be prevented during the molding process. To prevent voids, overmolding material is injected into the mold cavities at a very slow rate. The mold system 400 facilitates high volume manufacturing of the overmolding caps formed on substrates. The concept of system 400 can be extended to a larger number of cavities that suit the needs for high volume throughput.

Figure 5:
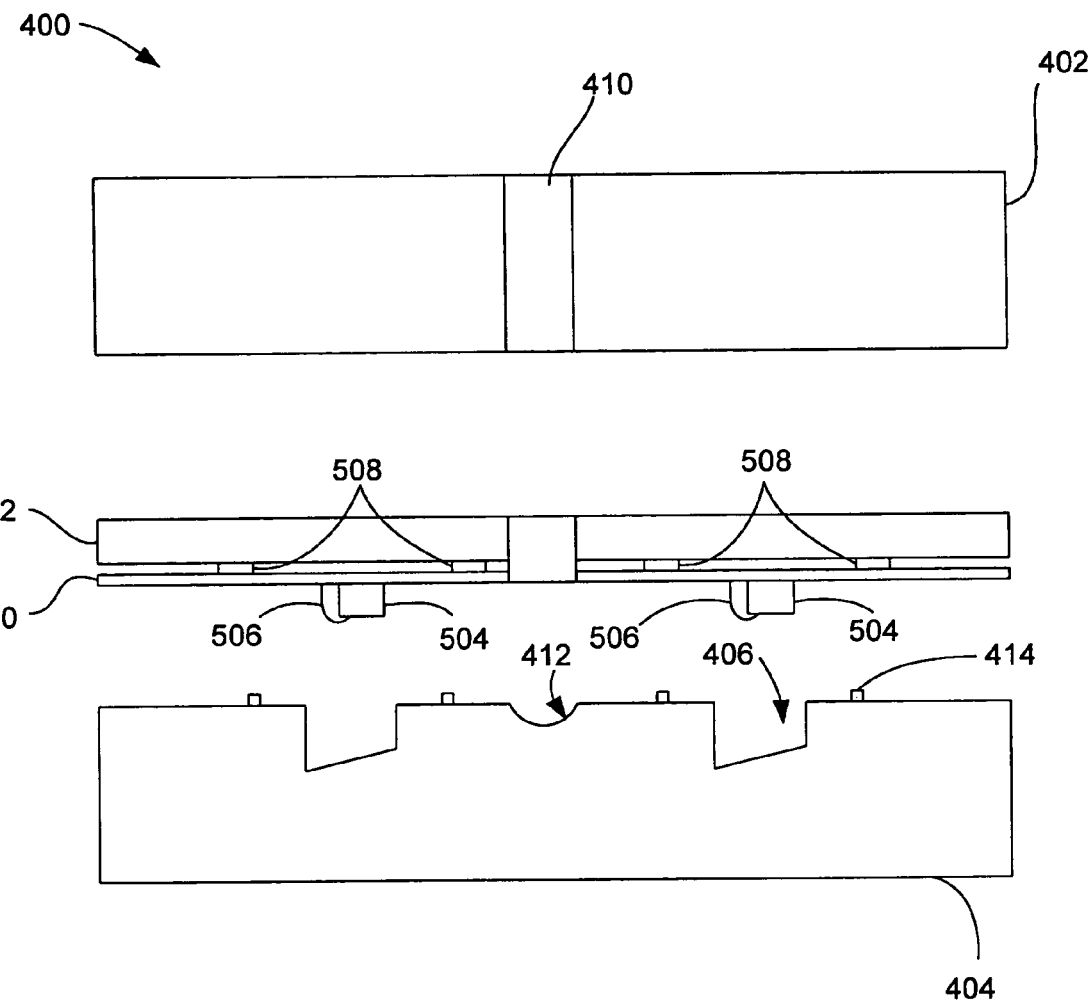
FIG. 5 illustrates a side plan view of the mold system with a flexible substrate attached to a rigid carrier that is placed between the mold system.

FIG. 5 illustrates a side plan view of the mold system 400 with a flexible substrate 500 attached to a rigid carrier 502 that is placed between the mold system 400. The rigid carrier 502 is an alternative technique for maintaining the shape of the flexible substrate 500 throughout the molding, die attach, wirebonding and other handling processes. The advantage of the rigid carrier 502 is that the rigid carrier will allow extendability to multi-cavity tools without the concern for loose tolerances obtained with a flexible substrate. Furthermore, the carrier will also provide more precision in the indexing holes compared to holes made in a thin flexible substrate.

Figure 6:
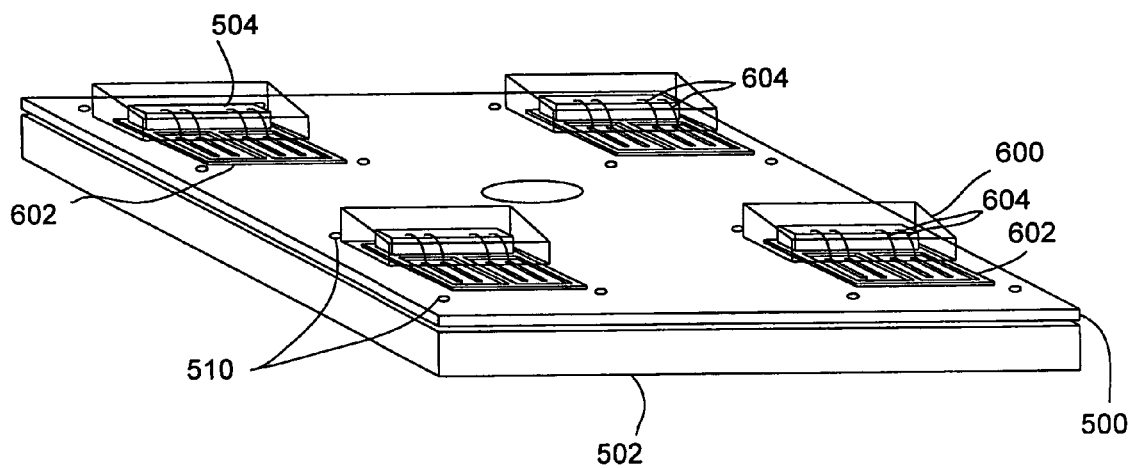
FIG. 6 illustrates a top perspective view of the substrate mounted onto the rigid carrier of FIG. 5, after overmolding caps have been formed.

The carrier 502 can be made out of FR4 (printed circuit board epoxy/fiberglass material), a polymer, or a thick copper layer. The flexible substrate 500 has attached photonic devices 504 that are connected to the substrate 500 with bond wires 506. The substrate 500 is attached to the rigid carrier 502 in selected areas between each of the photonic devices 504 with adhesive material 508. The adhesive material 508 is positioned to allow for both the substrate and the rigid carrier 502 to be cut into individual pieces after the molding of the caps are completed. FIG. 6 illustrates a top perspective view of the substrate 500 mounted onto the rigid carrier 502 of FIG. 5, after overmolding caps 600 have been formed over the photonic devices 504. Photonic devices 504 are set upon and connected to the electrically conductive circuit patterns 602 with bonding wires 604. Indexing holes 510 in the substrate are illustrated. However, in alternative embodiments, the indexing holes 510 are preferably formed in the rigid carrier 502.

To facilitate the molding process, a release film layer can be used to coat the surface of the mold cavities 406. The overmolding material contains no fillers because of the clear quality required for light transmission. Therefore the overmolding has lower viscosity and has a greater tendency to flow outside of the mold cavities during the molding processes. This overflow causes undesirable flash areas to form on the substrate 500. One method of preventing flash is to utilize a release film layer that is placed on the bottom mold 404 so that it conforms to the shape of the cavities 406. This film is compressible such that when the top and bottom mold dies are pressed together, the film is compressed and causes each of the mold cavities to be more completely sealed. The sealed cavities now do not allow overmolding material to overflow and cause flash to form. In addition to facilitating a better seal within each of the cavities 406, the release film prevents contact between a molding resin and the cavity surface of the mold and can facilitate heat transfer between the mold and the overmold material to accelerate manufacturing processes. Suction is required from air vents in the bottom mold 404 so to suck the release film to conform to the shape of the cavities. See U.S. Pat. Nos. 5,891,384 and 5,891,483, which are hereby incorporated by reference.

Figure 7:
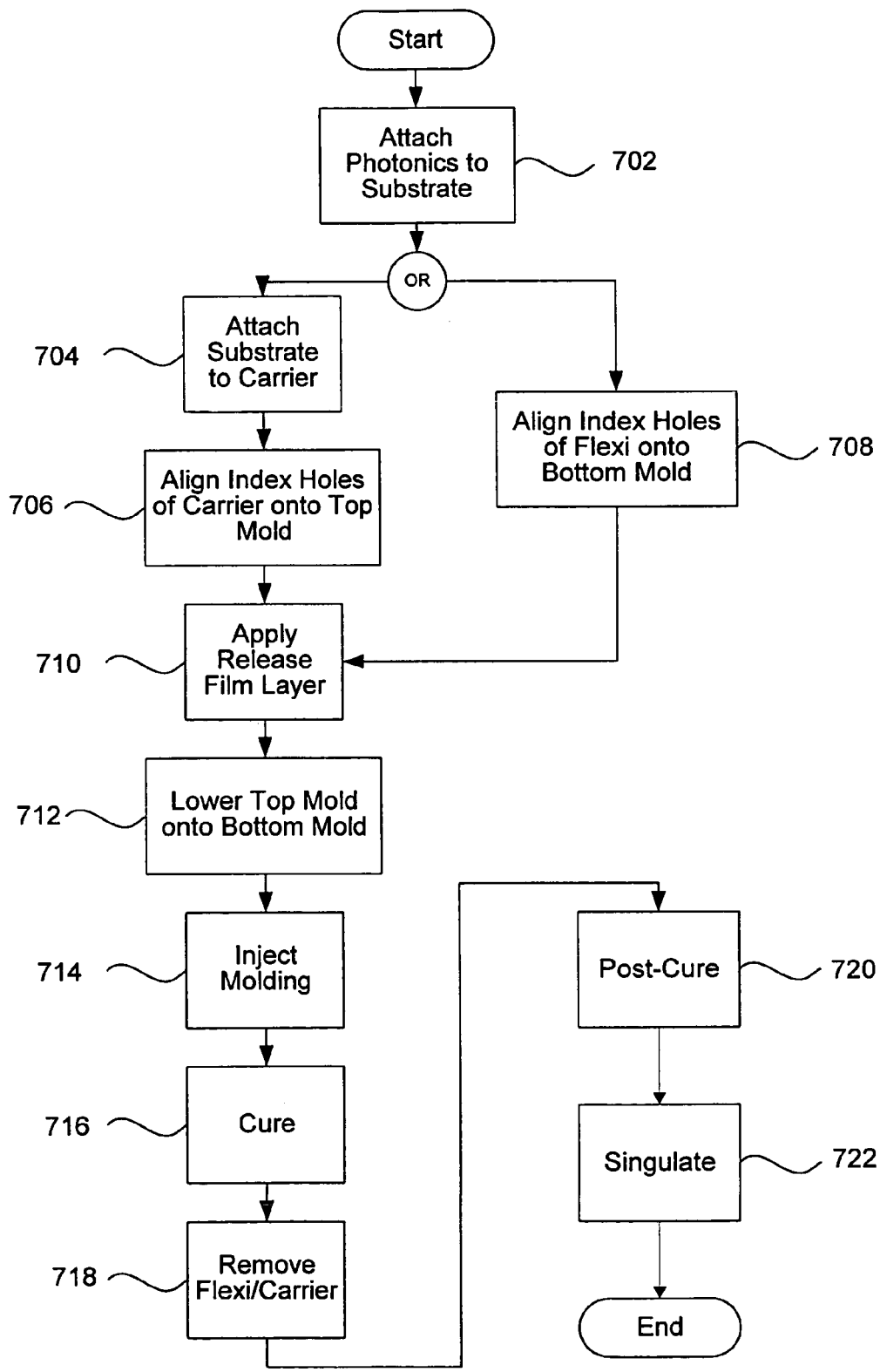
FIG. 7 illustrates a flow diagram of the process for manufacturing a clear overmolding cap over a photonic device, according to one embodiment of the present invention.

FIG. 7 illustrates a flow diagram 700 of the process for manufacturing a clear overmolding cap over a photonic device, according to one embodiment of the present invention. The process begins with operation 702 wherein photonic devices are attached to a substrate. The photonic devices are adhesively attached and electrically connected to the electrical traces on the substrate with bond wires. From operation 702, two alternative techniques can be employed. The first technique is that of operation 704 wherein the substrate is attached to a rigid carrier, which functions to maintain the shape of the substrate during the molding process. In this case, the next operation 706 represents the aligning of the indexing holes on the surface of the rigid carrier with the indexing pins of the top mold. Alternatively, the second technique does not employ the rigid carrier. In this case, as shown in operation 708, the indexing holes formed in the substrate itself are aligned with the indexing pins of the bottom mold.

Figure 8:
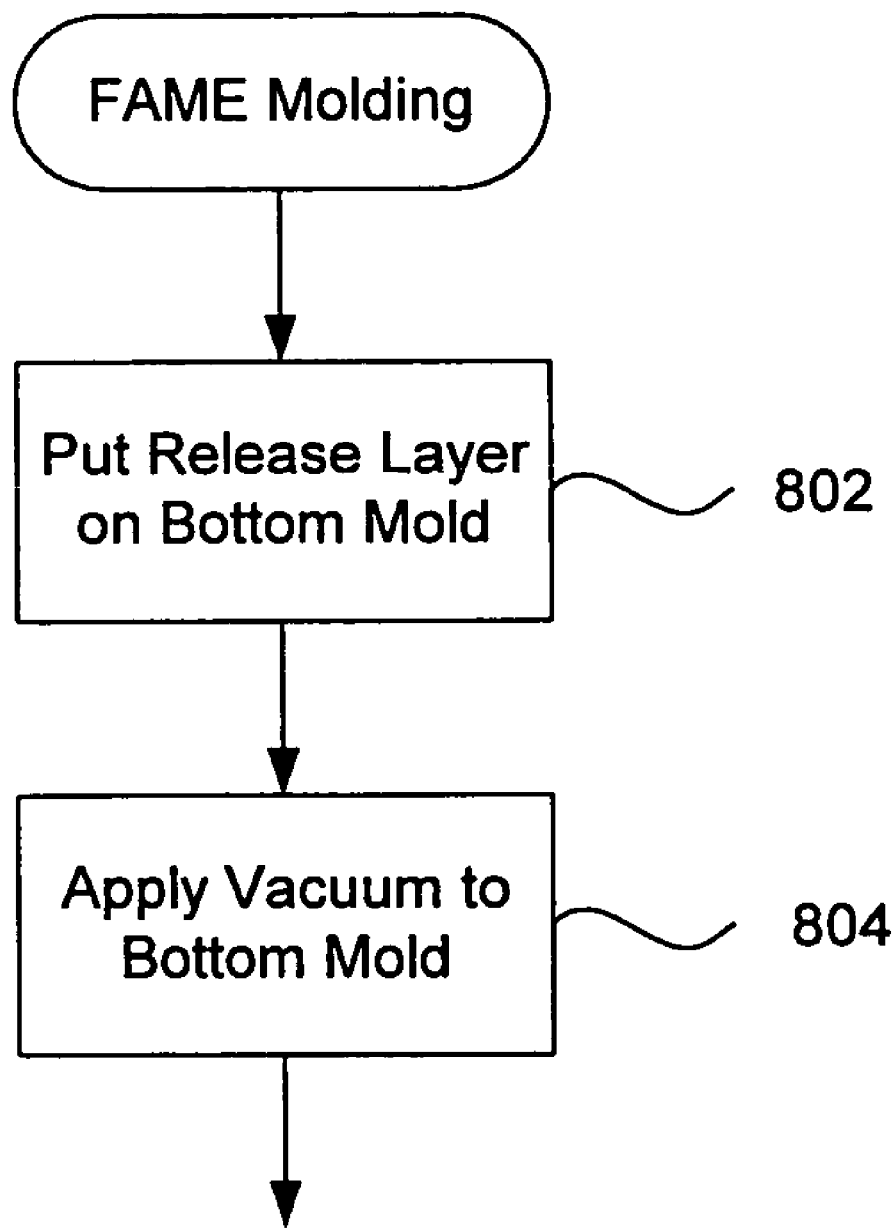
FIG. 8 illustrates the detailed operations of using the release film layer.

In operation 710, the release film layer is applied to the molding system so that a better seal within each of the cavities can be achieved. As mentioned above, the release film layer assists in preventing flash, protects the mold cavities from contact from the overmolding material and assists in the heat transfer between the mold system and the overmolding material. FIG. 8 illustrates the detailed operations of using the release film layer. In FIG. 8, the operation 802 shows that the first step of using the release film is to apply the release film layer to the bottom mold. Then in operation 804, air is sucked out of the cavities to assist the release film layer in conforming to the shape of the cavities. It is noted that the use of the release film layer is an optional process. The release film can be of different thickness ranging from 2 to 4 mils (50 to 100 microns). Selection of the right thickness needs to be done in conjunction with the mold tooling design (e.g., cavity depth, runner depth, gate, etc.) so to ensure that the correct part dimensions can be obtained within specified tolerances. Potential materials that can be used for the release film can include polyimide (PI) or polytetrafluoroethylene (PTFE).

Then in operation 712, the top mold is lowered onto the bottom mold to secure the substrate (and rigid carrier) between the two molds. In operation 714, molding material is injected into the molds through the hole in the top mold and through the runners formed in the bottom mold. In operation 716, the molding material is given time to cure. In operation 718, the substrate with the formed overmolding caps are removed from the top and bottom mold. In operation 720, a post-curing process allows the overmolding caps to further cure. In operation 722, the substrate, and carrier if used, are singulated into individual substrate/cap modules. These modules can then be used in combination with a semiconductor device to form an optoelectronic module.

Figure 9:
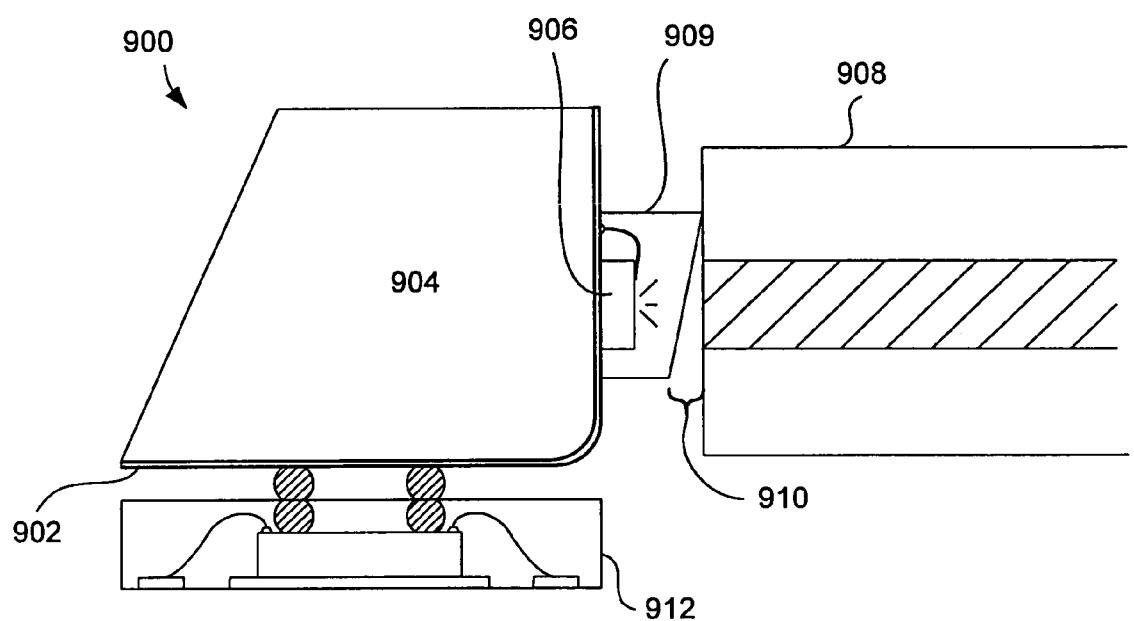
FIG. 9 illustrates an optoelectronic package incorporating the overmolding cap in accordance with one embodiment of the invention.

Referring next to FIG. 9, an optoelectronic package 900 in accordance with another embodiment of the invention will be described. In the illustrated embodiment, a flexible substrate material 902 having conductive traces (not shown) thereon is supported by support structure 904. A photonic device (die) 906 is mounted and electrically connected to the flexible substrate 902 such that the facet (active region) of the photonic device is exposed outward towards the optical fiber 908. An optically clear cap 909 is formed over the photonic device 906 and determines the standoff of the fiber 908 from the substrate 902. The optical interface region 910 in this embodiment may take a form similar to the interface region 302 illustrated in FIG. 3. In this example, one or more bond pads on the die are electrically coupled to one end of the flexible substrate. The flexible substrate is wrapped around one corner of the optical base 904 and is electrically coupled to a separate die 912 that includes suitable circuitry to drive the photonic device 906. The illustrated structure is described in more detail in co-pending application Ser. No. 10/165,553.

Of course, the number of emitters or receivers on a particular device can be widely varied to meet the needs of a particular application. In many multi-channel applications, it is desirable to separate the emitters from the receivers in different chips. This is primarily due to the nature of electrical cross-talk between the transmitter and receiver circuitry. However integrated transceivers can readily be provided as well.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

The invention claimed is:

1. A method of manufacturing an optoelectronic device comprising:
    attaching a photonic device directly or indirectly to a flexible substrate;
    attaching the flexible substrate onto a rigid carrier, whereby the rigid carrier maintains the flexible substrate in a fixed position;
    placing the flexible substrate and the rigid carrier onto a lower mold such that the photonic device is lowered into a molding cavity within the lower mold; and forming an optically clear cap on the base substrate by flowing a clear resin into a molding cavity of a molding die.

2. A method of manufacturing an optoelectronic device as recited in claim 1 wherein the molding cavity of the mold has a bottom surface that is slanted at an angle approximately between 7–8 degrees.

3. A method of manufacturing an optoelectronic device as recited in claim 1 further comprising:

lowering a top mold onto the rigid carrier such that the flexible substrate is firmly secured between the top and bottom mold and photonic device is sealed within the molding cavity.

4. A system for manufacturing an optoelectronic package comprising:

a flexible substrate having at least one electrically conductive trace thereon;

a photonic device carried by the base substrate, the photonic device having an active facet and at least one bond pad thereon;

a rigid carrier that supports the flexible substrate such that the rigid carrier maintains the flexible substrate in a fixed position;

a lower mold having a molding cavity, which receives the photonic device, the molding cavity configured to be filled with a clear resin material that will harden and form a optically clear cap that covers the photonic device; and an upper mold configured to press the rigid carrier and the flexible substrate against the lower mold such that a good seal can be created between a contact region between the flexible substrate and the molding cavity.

5. A system for manufacturing an optoelectronic package as recited in claim 4 wherein the lower mold has a plurality of molding cavities, each cavity configured to receive at least one photonic device.

6. A system for manufacturing an optoelectronic package as recited in claim 4 wherein the molding cavity has a slanted bottom surface such that the optically clear cap to be formed will have a slanted top surface.

* * * * *